United States Patent
Chen et al.

(10) Patent No.: US 11,307,237 B2
(45) Date of Patent: Apr. 19, 2022

(54) METHOD FOR FAULT LOCATION TO SINGLE-TERMINAL TRAVELING WAVE

(71) Applicant: Shandong University of Technology, Zibo (CN)

(72) Inventors: Yu Chen, Zibo (CN); Jinghua Wang, Zibo (CN); Bingyin Xu, Zibo (CN); Ke Peng, Zibo (CN); Wei Wang, Zibo (CN)

(73) Assignee: Shandong University of Technology, Zibo (CN)

( * ) Notice: Subject to any disclaimer, the term of this patent is extended or adjusted under 35 U.S.C. 154(b) by 0 days.

(21) Appl. No.: 17/013,881

(22) Filed: Sep. 8, 2020

(65) Prior Publication Data
US 2021/0156900 A1 May 27, 2021

(30) Foreign Application Priority Data
Nov. 25, 2019 (CN) .......................... 201911166964.2

(51) Int. Cl.
*G01R 31/08* (2020.01)
*G01R 31/11* (2006.01)

(52) U.S. Cl.
CPC ......... *G01R 31/088* (2013.01); *G01R 31/085* (2013.01); *G01R 31/11* (2013.01)

(58) Field of Classification Search
CPC .... G01R 31/085; G01R 31/088; G01R 31/11; H02H 7/265
See application file for complete search history.

(56) References Cited

U.S. PATENT DOCUMENTS

| 6,597,180 | B1 * | 7/2003 | Takaoka | G01R 31/088 324/512 |
| 2009/0315565 | A1 * | 12/2009 | Wyar | G01R 31/11 324/533 |
| 2014/0229127 | A1 * | 8/2014 | Ren | G01R 31/088 702/59 |

FOREIGN PATENT DOCUMENTS

CN 108020754 A * 5/2018

OTHER PUBLICATIONS

Matrix Reshish—Result of Matrix Inversion, https://matrix.reshish.com/inverse.php, accessed Aug. 14, 2021. (Year: 2021).*

* cited by examiner

*Primary Examiner* — Michael J Dalbo
(74) *Attorney, Agent, or Firm* — Idea Intellectual Limited; Margaret A. Burke; Sam T. Yip

(57) ABSTRACT

A method for fault location to single-terminal traveling wave includes steps as follows. Step (a): recording a waveform of a traveling wave signal of disturbance by a traveling wave device when a line disturbance occurs. Step (b): performing a phase mode transformation on the waveform recorded by the step (a), so as to obtain components of line mode and zero mode of a fault initial traveling wave, and performing a wavelet transform to decompose the components of the line mode to obtain singularities in the waveform of the traveling wave. Step (c): calculating a wavefront slope k of the components of the line mode of the fault initial traveling wave. Step (d): computing a preliminary fault distance D according to the slope k computed in the step (c). Step (e): confirming a fault point according to the preliminary fault distance and wavelet singularities of the components of the line mode. Step (f): end.

7 Claims, 3 Drawing Sheets

METHOD FOR FAULT LOCATION TO SINGLE-TERMINAL TRAVELING WAVE

CROSS-REFERENCES TO RELATED APPLICATIONS

This application claims priority to the Chinese patent application No. 201911166964.X filed on Nov. 25, 2019, and the disclosures of which are incorporated herein by reference in their entirety.

FIELD OF THE INVENTION

A method for fault location to single-terminal traveling wave, which belongs to the field of power line fault ranging and location technology.

BACKGROUND OF THE INVENTION

Traveling wave ranging technology has been widely applied to power systems due to high precision and wide application ranges. Generally, ranging principle applied by the existing traveling wave ranging systems is mainly based on double-terminal traveling wave in a line, and single-terminal traveling wave acts as supplements. The ranging principle with the double-terminal traveling wave only takes time difference, line lengths, and wave velocity of initial traveling wave of disturbance arriving at electrical substations at both terminals of the line, and then the ranging results can be automatically computed in actual operations. Therefore, such manner has been widely applied.

In addition to arrangement as a double-terminal power line, the existing traveling wave ranging system often monitors many lines with only one side installed with traveling wave ranging devices. Traveling wave ranging for these lines needs to apply principle of single-terminal traveling wave ranging. The principle of the single terminal traveling wave ranging uses wave head of the initial traveling wave of fault and reflected wave head of a fault point which are received at a measurement point to range the fault. For the principle of the single-terminal traveling wave fault ranging, the correct identification of the reflected wave of the fault point is a key factor for achieving accurate and reliable fault ranging. However, due to the influence of fault line and bus lines or other lines, it is difficult to identify reflected wave head of a fault point. Theoretically, whether the wave head comes from the fault line itself, the fault line in combination with bus lines, or other lines can be computed by the concept of directional traveling wave. However, at present, a traveling wave ranging system running in a power system generally only collects current traveling wave or voltage traveling wave, which cannot form directional traveling wave.

SUMMARY OF THE INVENTION

The technical problem to be solved by the present invention is how to overcome the shortcomings of the prior art. A single-terminal traveling wave based fault locating method is provided. The method is based on a relationship between wavefront information of initial traveling wave of disturbance and a fault distance and is in combination with the single-terminal traveling wave ranging method, so as to accurately calibrate a reflected wave head of a disturbance point.

The technical solutions provided by the present invention for solving the technical problems include a method for fault location to single-terminal traveling wave including steps operated by a main site and a plurality of electrical substations connected to the main site via a communication network. Each of the electrical substation is equipped with a traveling wave recording system. The method includes steps as follows.

step (a): recording a waveform of a traveling wave signal of a line disturbance by a traveling wave device when the line disturbance occurs;

step (b): performing a phase mode transformation on the waveform recorded by the step (a), so as to obtain components of line mode and zero mode of a fault initial traveling wave, and performing a wavelet transform to decompose the components of the line mode to obtain wavelet singularities in the waveform of the traveling wave;

step (c): calculating a wavefront slope k of the components of the line mode of the fault initial traveling wave;

step (d): computing a preliminary fault distance D according to the slope k computed in the step (c);

step (e): confirming a fault point according to the preliminary fault distance and wavelet singularities of the components of the line mode; and step (f): ending the steps.

In preferred embodiments, the phase mode transformation in the step (b) is performed by adopting a Karen Boolean transformation, which has a phase mode transformation matrix as:

$$S = \begin{bmatrix} 1 & 1 & 1 \\ 1 & -2 & 1 \\ 1 & 1 & -2 \end{bmatrix}; S^{-1} = \frac{1}{3}\begin{bmatrix} 1 & 1 & 1 \\ 1 & -1 & 0 \\ 1 & 0 & -1 \end{bmatrix}.$$

In preferred embodiments, the wavelet transform performed on the components of the line mode is implemented by:

$$\begin{cases} S_{2^j}f(n) = \sum_k h_k S_{2^{j-1}}f(n - 2^{j-1}k) \\ W_{2^j}f(n) = \sum_k g_k S_{2^{j-1}}f(n - 2^{j-1}k) \end{cases},$$

where $j \in [1, \infty]$; $S_{2^j}f(n)$ is an approximation component of a result of the wavelet transform; $W_{2^j}f(n)$ is a wavelet components of the result of the wavelet transform; $\{h_k\} = \{0.125, 0.375, 0.375, 0.125\}$ ($k = -1, 0, 1, 2$); and $\{g_k\} = \{-2, 2\}$ ($k = 0, 1$).

In preferred embodiments, calculating the wavefront slope k of the components of the line mode of the fault initial traveling wave during the step (c) includes: defining a wave head corresponding to the maximum value of a first mode which is detected after the wavelet transform as the fault initial traveling wave, and normalizing a component of a zero mode of the wave head such that the collected components of the zero mode of the wave head is amplified to a reference value, and rest of values are scaled up, wherein the reference value is 0.5 kA, and wherein a slope of the normalized wave head is computed by selecting points thereof, which is performed by selecting three sampling points from an initial point and linearly fitting the three selected sampling points with a least square method to obtain the slope k.

In preferred embodiments, the selecting the initial point includes: setting a threshold value as 0.1 kA with respect to the components of the zero mode of the wave head of the normalized fault initial traveling wave, wherein the initial point is a first point that is greater than the threshold value.

In preferred embodiments, the least square method is performed by formulas by:

$$\begin{cases} y = kx + b \\ 3b + k\sum_{i=1}^{3} x_i = \sum_{i=1}^{3} y_i \\ b\sum_{i=1}^{3} x_i + k\sum_{i=1}^{3} x_i^2 = \sum_{i=1}^{3} y_i x_i \end{cases}$$

In preferred embodiments, computing the preliminary fault distance D in the step (d) is performed by formulas by:

$$k = 2700 D^{(-0.9990+0.0136\rho)} \left(\frac{\rho}{100}\right)^{-0.4568},$$

where k is the wavefront slope, D is the distance to the disturbance (i.e. fault) point, and $\rho$ is soil resistivity.

In preferred embodiments, confirming the fault point in the step (e) includes: according to the preliminary fault distance D computed in the step (d) and the wavelet singularities of the components of the line mode obtained in the step (b), taking D as a center and setting a range as the center $\pm D*20\%$, and selecting a wave head of the traveling wave from the range such that a fault distance is obtained by multiplying a time difference between the fault initial traveling wave and a fault wave reflection wave by traveling wave propagation velocity, wherein if there is more than one wave head, min(|D−d|) is applied to, and wherein d is disturbance point distance corresponding to the wave head, and then the fault distance is obtained by multiplying the time difference between the fault initial traveling wave and the fault point reflection wave by the traveling wave propagation velocity.

As compared with the prior art, the present invention has the following advantages.

1. In this single-terminal traveling wave fault location method, the method is based on a relationship between wavefront information of initial traveling wave of disturbance and a fault distance and is in combination with the single-terminal traveling wave ranging method, so as to accurately calibrate a reflected wave head of a disturbance point. Compared with the frequency ranging method, since the power operation and maintenance staff may have less knowledge of the traveling wave ranging principle, the method of the present invention can help the power operation and maintenance staff to more easily analyze the large number of waveforms of single-terminal traveling wave of the fault immediately.

2. In this single-terminal traveling wave fault location method, the fault point can be accurately identified by the traveling wave signal only, and other signals are unnecessary. Moreover, the method can not only perform the ranging to the fault in the line but be used for location to a disturbance point that does not cause the line fault, such that the method has a wide range of applications.

3. The traveling wave generated by the fault point is a non-stationary high-frequency signal, and thus the wavelet transform with good time-frequency localization ability is introduced to analyze the traveling wave signal. Regarding the recorded traveling wave waveform data, the maximum value by the wavelet transformation can be used to accurately mark the arrival time of the initial traveling wave and the possible disturbance point. Due to the influence of the disturbance line with other lines of the bus, the maximum value by the wavelet transformation cannot uniquely determine the reflected wave head of the disturbance point, but signal singularities can be listed. In general, the position of the reflected wave head of the disturbance point is located at a certain point in the list. The way that the single-terminal traveling wave ranging obtains the fault distance is by multiplying the time difference between the fault initial traveling wave and the fault point reflection wave by the traveling wave propagation velocity. The identification of the fault point reflection wave is the main problem of the single-terminal method.

4. The method has its own characteristics, which means it only uses traveling wave information and does not rely on frequency information. Accordingly, it can be used to range fault that causes protection tripping and also can also locate slight disturbances in a power grid, thereby having good adaptability.

DETAILED DESCRIPTION

Figure 1:
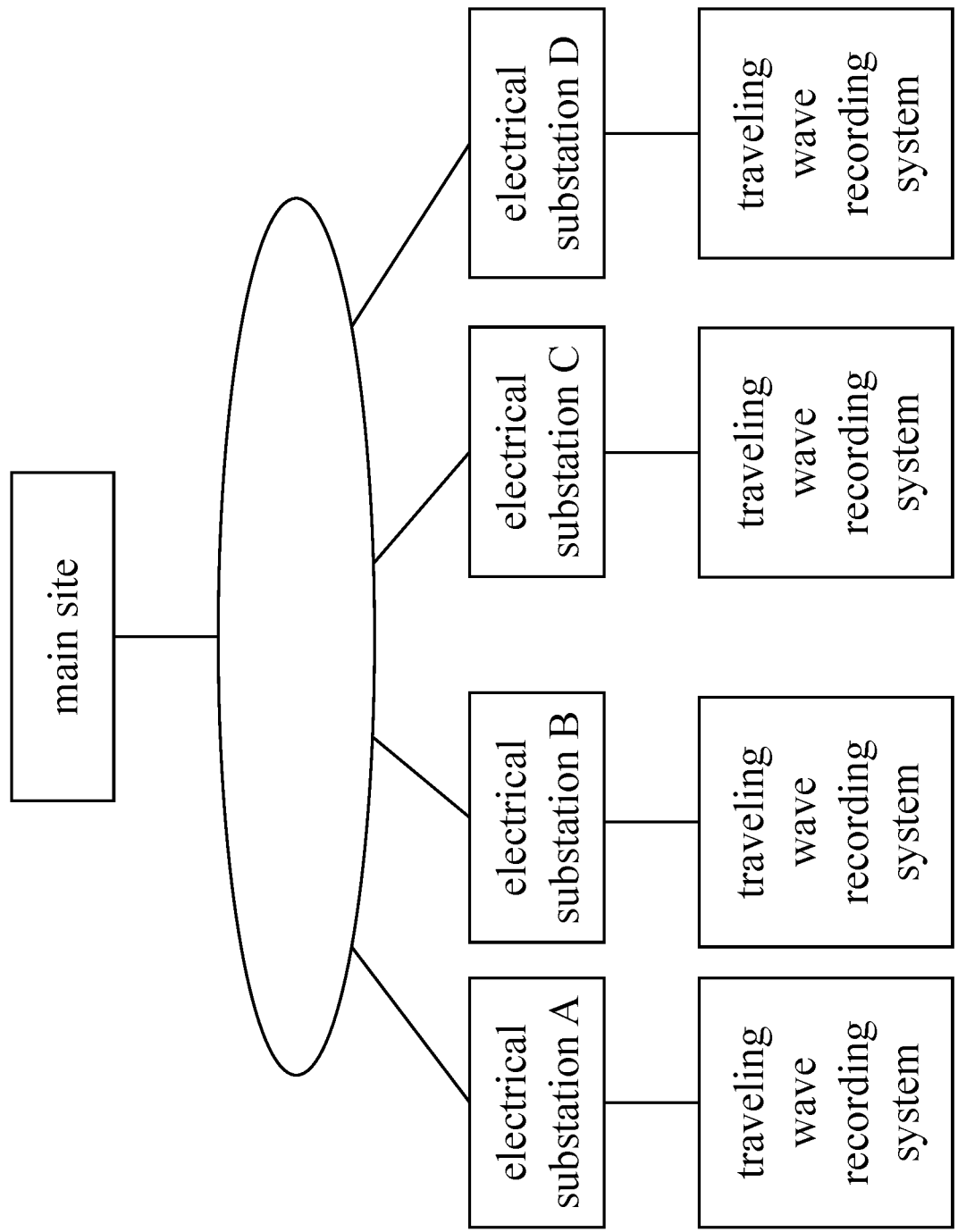
FIG. 1 shows a schematic diagram of a connection in a traveling wave ranging system.
Figure 2:
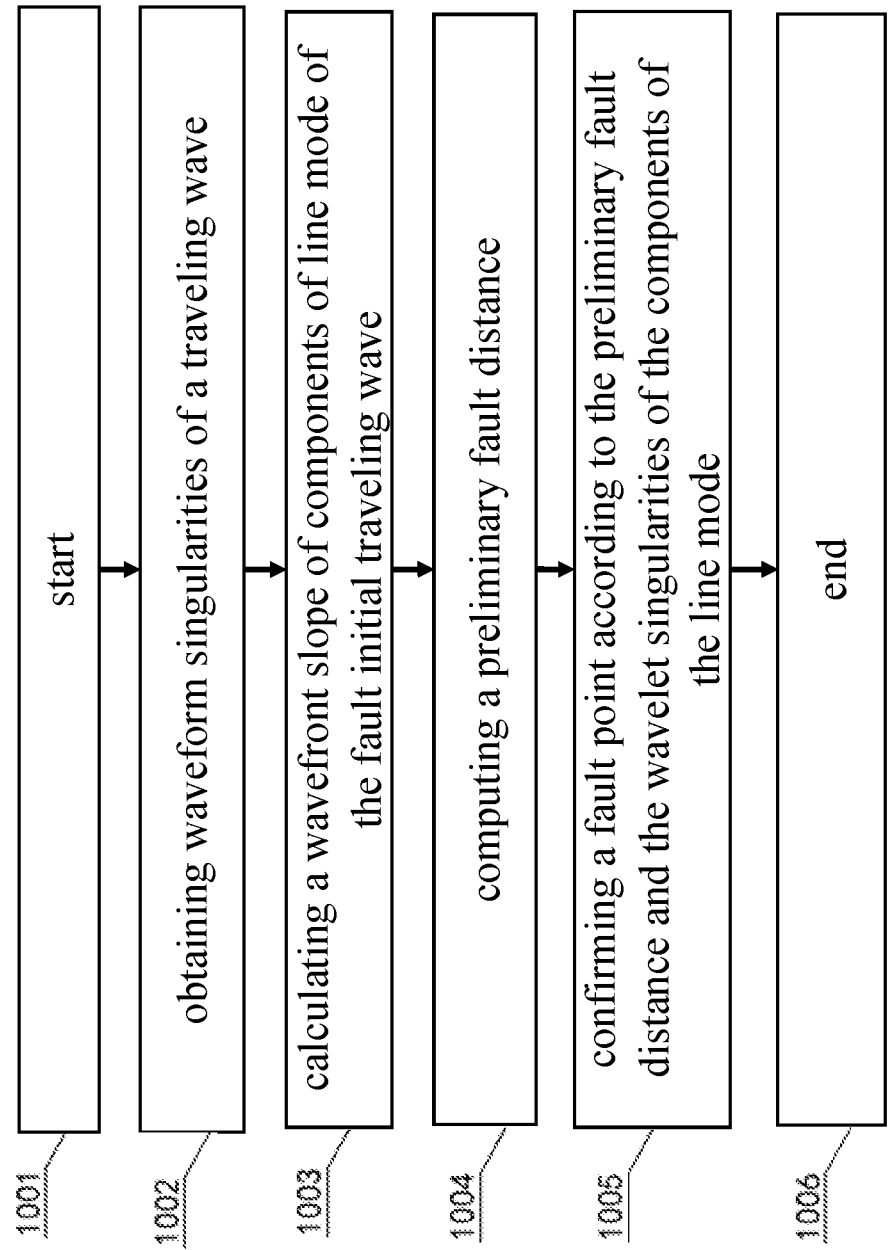
FIG. 2 is a flowchart of a method for fault location to single-terminal traveling wave.

FIGS. 1-2 are the best embodiments of the present invention. The following are in combination with FIGS. 1-2 to further explain the present invention.

A method for fault location to single-terminal traveling wave (i.e. a single-terminal traveling wave based fault locating method) includes steps operated by a traveling-wave ranging system as shown in FIG. 1. The traveling-wave ranging system includes a main site and several electrical substations, such as electrical substation A, electrical substation B, . . . , and electrical substation M. All the electrical substations are connected to the main site via a communication network, and each electrical substation is equipped with a traveling wave recording system. Similar to the existing technology, the traveling wave recording system is implemented by a computer in general, and a traveling wave recording software is executed by the computer. By the traveling wave recording system, the disturbance records recorded by traveling wave signal detection devices in the electrical substations can be received.

As shown in FIG. 2, the method for fault location to single-terminal traveling wave further includes step as follows.

Step 1001: start.

The method for fault location to single-terminal traveling wave is started.

Step 1002: obtaining singularities in waveform of a traveling wave. When line disturbance (i.e. lint fault) occurs, a traveling wave device records a traveling wave signal of the disturbance (e.g. including a waveform). First, a phase mode transformation is performed on the waveform, so as to obtain components of line mode and zero mode of initial traveling wave. The phase mode transformation adopts a Karen Boolean transformation, in which a phase mode transformation matrix thereof is as follows:

$$S = \begin{bmatrix} 1 & 1 & 1 \\ 1 & -2 & 1 \\ 1 & 1 & -2 \end{bmatrix}; S^{-1} = \frac{1}{3}\begin{bmatrix} 1 & 1 & 1 \\ 1 & -1 & 0 \\ 1 & 0 & -1 \end{bmatrix} \quad (1)$$

A wavelet transform is performed for decomposing the components of the line mode to obtain the singularities in the waveform of the traveling wave. The wavelet transform is implemented by Mallat algorithm as follows.

$$\begin{cases} S_{2^j}f(n) = \sum_k h_k S_{2^{j-1}}f(n-2^{j-1}k) \\ W_{2^j}f(n) = \sum_k g_k S_{2^{j-1}}f(n-2^{j-1}k) \end{cases} \quad (2)$$

where $j \in [1, \infty]$; $S_{2^j}f(n)$ is the approximation components of the wavelet transform result; $W_{2^j}f(n)$ is the wavelet components of the transformation result; $\{h_k\}=\{0.125, 0.375, 0.375, 0.125\}(k=-1, 0, 1, 2)$; $\{g_k\}=\{-2, 2\}(k=0, 1)$.

The singularities include initial time of the disturbance, arrival time of a disturbance point reflection wave (i.e. a fault point reflection wave), and arrival time of the reflection wave of an impedance mismatching point on the line.

Step 1003: calculating a wavefront slope of the components of the line mode of the fault initial traveling wave (i.e. the disturbance initial traveling wave).

After the wavelet transform, the wave head corresponding to the maximum value of a first mode which is detected is the disturbance initial traveling wave. The zero mode components of the wave head is normalized, and three sampling points are selected from an initial point for linearly fitting them with a least square method to obtain the wavefront slope k.

The selection method to the initial point is as follows: for the zero mode components of the wave head of the normalized disturbance initial traveling wave, a threshold value is set as 0.1 kA, and the initial point is a first point that is greater than the threshold value.

The least square method is realized by the following formula:

$$\begin{cases} y = kx + b \\ 3b + k\sum_{i=1}^{3} x_i = \sum_{i=1}^{3} y_i \\ b\sum_{i=1}^{3} x_i + k\sum_{i=1}^{3} x_i^2 = \sum_{i=1}^{3} y_i x_i \end{cases} \quad (3)$$

Step 1004: calculating a preliminary fault distance (i.e. a preliminary disturbance distance).

The slope k computed in the step 1003 is substituted into the following formula (4) to compute the preliminary fault distance D:

$$k = 2700 D^{(-0.9990+0.0136\rho)}\left(\frac{\rho}{100}\right)^{-0.4568} \quad (4)$$

Step 1005: the fault point is confirmed according to the preliminary fault distance and the wavelet singularities of the components of the line mode.

According to the preliminary fault distance D computed in the step 1004 and the wavelet singularities of the components of the line mode obtained in the step 1002, with taking D as a center and setting a range as the center ±D*20%, a wave head is selected from the range. A fault distance is obtained by multiplying a time difference between the fault initial traveling wave and the fault point reflection wave by the traveling wave propagation velocity. If there is more than one wave head, min(|D−d|) is applied to, in which d is the disturbance point distance corresponding to the wave head, and then the fault distance is obtained by multiplying a time difference between the fault initial traveling wave and the fault point reflection wave by the traveling wave propagation velocity.

Step 1006: end.

Figure 3:
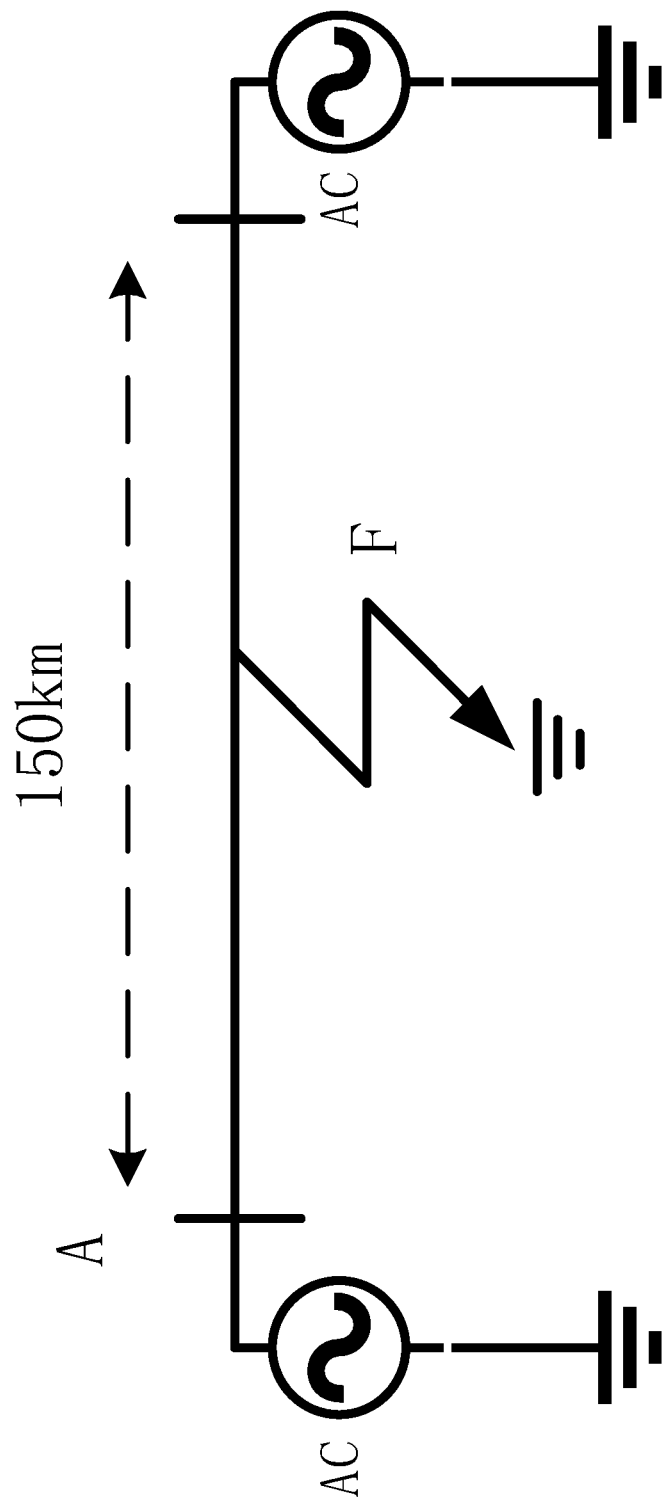
FIG. 3 shows a schematic diagram of a line topology and length of a double-terminal 220 kV transmission line.

Taking a double-terminal transmission line with 220 kV as an example, a topology and length of the line are shown in FIG. 3. The line is an overhead line, and propagation velocity of traveling wave in the line is 291 m/us. As illustration, a traveling wave detection device is equipped to a node A for collecting traveling wave signals.

PSCAD is applied to establishing a corresponding simulation model. Fault occurs at a node F away from a node A by 60 km. The fault occurrence time is set as 0 s, and the soil resistivity ρ was set as 100 Ω·M.

Step 1001: after the line fault occurs, the acquisition point A collects and uploads a traveling wave signal.

Step 1002: obtaining singularities in waveform of traveling wave.

When line disturbance occurs, a traveling wave device records a traveling wave signal of the disturbance. First, a phase mode transformation is performed on waveform recorded in the step 1001, so as to obtain components of line mode and zero mode of initial traveling wave. A wavelet transform is performed on the component, so as to obtain a list of the singularities in the waveform of the traveling wave.

The phase mode transformation matrix is as follows:

$$S = \begin{bmatrix} 1 & 1 & 1 \\ 1 & -2 & 1 \\ 1 & 1 & -2 \end{bmatrix}; S^{-1} = \frac{1}{3}\begin{bmatrix} 1 & 1 & 1 \\ 1 & -1 & 0 \\ 1 & 0 & -1 \end{bmatrix}.$$

The wavelet transform is performed as follows.

$$\begin{cases} S_{2^j}f(n) = \sum_k h_k S_{2^{j-1}}f(n-2^{j-1}k) \\ W_{2^j}f(n) = \sum_k g_k S_{2^{j-1}}f(n-2^{j-1}k) \end{cases} \quad (2)$$

where $j \in [1, \infty]$; $S_{2^j}f(n)$ is the approximation components of the wavelet transform result; $W_{2^j}f(n)$ is the wavelet components of the transformation result; $\{h_k\}=\{0.125, 0.375, 0.375, 0.125\}(k=-1, 0, 1, 2)$; $\{g_k\}=\{-2, 2\}(k=0, 1)$.

TABLE 1 singularity list

| singularity | time (μs) | possible disturbance distance (km) |
|---|---|---|
| 1 | 205 | — |
| 2 | 616 | 60.5 |
| 3 | 822 | 90.1 |

TABLE 2 zero mode component of initial traveling wave

| time (μs) | zero mode of initial traveling wave (kA) | after normalizing(kA) |
|---|---|---|
| 0 | 0.00459940950968730 | 0.00980000000000000 |
| 1 | 0.0138454460763030 | 0.0291917124911631 |
| 2 | 0.0290769626481030 | 0.0611367721971993 |
| 3 | 0.0480362961866330 | 0.100900182427558 |
| 4 | 0.0680354190231550 | 0.142844342752596 |
| 5 | 0.0875682731845390 | 0.183810597785266 |
| 6 | 0.106025897198460 | 0.222521772629663 |

Step 1003: calculating a wavefront slope k of the components of the zero mode of the fault initial traveling wave. As shown in table 2, there are the components of the zero mode of the wave head of the disturbance initial traveling wave and the data generated by normalizing them. According to the normalized data, a first point greater than the threshold value of 0.1 kA is selected as an initial point, and three points from the initial point are selected.

The three selected sampling points (0.1009, 0.1428, 0.1838) are linearly fitted with the least square method, and the slope k is 39.83 A/μs.

The formula of least square method is as follows:

$$\begin{cases} y = kx + b \\ 3b + k\sum_{i=1}^{3} x_i = \sum_{i=1}^{3} y_i \\ b\sum_{i=1}^{3} x_i + k\sum_{i=1}^{3} x_i^2 = \sum_{i=1}^{3} y_i x_i \end{cases} \quad (1)$$

Step 1004: substituting the slope k computed in the step 1003 into the following formula (2) to compute a preliminary fault distance D:

$$k = 2700 D^{(-0.9990+0.0136\rho)} \left(\frac{\rho}{100}\right)^{-0.4568} \quad (2)$$

Step 1005: confirming the fault point according to the preliminary fault distance D and the wavelet singularities of the component in the line. With taking D as a center and setting a range as the center ±D*20%, a wave head is selected from the range. A fault distance is obtained by multiplying a time difference between the fault initial traveling wave and the fault point reflection wave by the traveling wave propagation velocity, which computes that the fault distance is 60.5 km.

The above descriptions are only better embodiments of the present invention, and do not serve as a restriction on the present invention for other forms. A person having ordinary skill in the art may use the above disclosed technical contents to vary or modify it into equivalent embodiment with equivalent variation. However, any simple variation, equivalent variation, and modification made to the above embodiments according to the substantial technology of the present invention, which is not divorced from the technical solution of the present invention, still belongs to the protection scope of the technical scheme of the present invention.

What is claimed is:

1. A single-terminal traveling wave based fault locating method comprising steps operated by a main site and a plurality of electrical substations connected to the main site via a communication network, each of the electrical substations equipped with a traveling wave recording system, the method comprising:
   step (a): recording a waveform of a traveling wave signal of a line disturbance by a traveling wave device when the line disturbance occurs;
   step (b): performing a phase mode transformation on the waveform recorded by the step (a), so as to obtain components of line mode and zero mode of a fault initial traveling wave, and performing a wavelet transform to decompose the components of the line mode to obtain wavelet singularities in the waveform of the traveling wave;
   step (c): calculating a wavefront slope k of the components of the line mode of the fault initial traveling wave, wherein calculating the wavefront slope k of the components of the line mode of the fault initial traveling wave during the step (c) comprises:
   defining a wave head corresponding to a maximum value of a first mode which is detected after the wavelet transform of the step (b) as the disturbance initial traveling wave, and normalizing the components of the zero mode of the wave head such that the collected components of the zero mode of the wave head is amplified to a reference value, and rest of values are scaled up, wherein the reference value is 0.5 kA, and wherein the slope of the normalized wave head is computed by selecting points thereof, which is performed by selecting three sampling points from an initial point and linearly fitting the three selected sampling points with a least square method to obtain the slope k;
   step (d): computing a preliminary fault distance D according to the slope k computed in the step (c);
   step (e): confirming a fault point according to the preliminary fault distance and the wavelet singularities of the components of the line mode; and
   step (f): ending the steps.

2. The single-terminal traveling wave based fault locating method of claim 1, wherein the phase mode transformation in the step (b) is performed by applying a Karen Boolean transformation, which has a phase mode transformation matrix as:

$$S = \begin{bmatrix} 1 & 1 & 1 \\ 1 & -2 & 1 \\ 1 & 1 & -2 \end{bmatrix}; S^{-1} = \frac{1}{3} \begin{bmatrix} 1 & 1 & 1 \\ 1 & -1 & 0 \\ 1 & 0 & -1 \end{bmatrix}.$$

3. The single-terminal traveling wave based fault locating method of claim 1, wherein the wavelet transform performed on the components of the line mode is implemented by:

$$\begin{cases} S_{2^j}f(n) = \sum_k h_k S_{2^{j-1}}f(n - 2^{j-1}k) \\ W_{2^j}f(n) = \sum_k g_k S_{2^{j-1}}f(n - 2^{j-1}k) \end{cases},$$

where $j \in [1, \infty]$; $S_{2^j}f(n)$ is an approximation component of a result of the wavelet transform;

$W_{2^j}f(n)$ is a wavelet components of the result of the wavelet transform;

$\{h_k\} = \{0.125, 0.375, 0.375, 0.125\}$ (k=−1, 0, 1, 2); and $\{g_k\} = \{-2, 2\}$ (k=0, 1).

4. The single-terminal traveling wave based fault locating method of claim 1, wherein the selecting the initial point comprises:

setting a threshold value as 0.1 kA with respect to the components of the zero mode of the wave head of the normalized disturbance initial traveling wave, wherein the initial point is a first point that is greater than the threshold value.

5. The single-terminal traveling wave based fault locating method of claim 1, wherein the least square method is performed by formulas:

$$\begin{cases} y = kx + b \\ 3b + k\sum_{i=1}^{3} x_i = \sum_{i=1}^{3} y_i \\ b\sum_{i=1}^{3} x_i + k\sum_{i=1}^{3} x_i^2 = \sum_{i=1}^{3} y_i x_i \end{cases}.$$

6. The single-terminal traveling wave based fault locating method of claim 1, wherein computing the preliminary fault distance D in the step (d) is performed by formulas:

$$k = 2700 D^{(-0.9990 + 0.0136\rho)} \left(\frac{\rho}{100}\right)^{-0.4568},$$

where k is the wavefront slope, D is the fault distance, and $\rho$ is soil resistivity.

7. The single-terminal traveling wave based fault locating method of claim 1, wherein confirming the fault point in the step (e) comprises:

according to the preliminary fault distance D computed in the step (d) and the wavelet singularities of the components of the line mode obtained in the step (b), taking D as a center and setting a range as the center ±D*20%, and selecting a wave head of the traveling wave from the range such that a fault distance is obtained by multiplying a time difference between the fault initial traveling wave and a fault point reflection wave by traveling wave propagation velocity, wherein if there is more than one wave head, min(|D−d|) is applied to, and wherein d is disturbance point distance corresponding to the wave head, and then the fault distance is obtained by multiplying the time difference between the fault initial traveling wave and the fault point reflection wave by the traveling wave propagation velocity.

\* \* \* \* \*